(12) United States Patent
Wang et al.

(10) Patent No.: US 9,620,648 B2
(45) Date of Patent: Apr. 11, 2017

(54) THIN FILM TRANSISTOR, ARRAY SUBSTRATE AND DISPLAY DEVICE

(71) Applicant: BOE TECHNOLOGY GROUP CO., LTD., Beijing (CN)

(72) Inventors: Meili Wang, Beijing (CN); Longbao Xin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/555,804

(22) Filed: Nov. 28, 2014

(65) Prior Publication Data

US 2016/0013319 A1 Jan. 14, 2016

(30) Foreign Application Priority Data

Jul. 14, 2014 (CN) .......................... 2014 1 0334219

(51) Int. Cl.
| | |
|---|---|
| *H01L 29/10* | (2006.01) |
| *H01L 29/12* | (2006.01) |
| *H01L 21/00* | (2006.01) |
| *H01L 21/16* | (2006.01) |
| *H01L 29/786* | (2006.01) |
| *H01L 29/34* | (2006.01) |
| *H01L 29/66* | (2006.01) |

(52) U.S. Cl.
CPC .......... *H01L 29/7869* (2013.01); *H01L 29/34* (2013.01); *H01L 29/66969* (2013.01); *H01L 29/78618* (2013.01)

(58) Field of Classification Search
CPC ........... H01L 29/7869; H01L 29/78693; H01L 29/78696; H01L 29/78618

USPC ...................... 257/43, 59, E29.273; 438/104
See application file for complete search history.

(56) References Cited

U.S. PATENT DOCUMENTS

| | | | |
|---|---|---|---|
| 2010/0200843 A1* | 8/2010 | Arai et al. ...................... 257/40 |
| 2010/0252832 A1* | 10/2010 | Asano et al. ................... 257/57 |
| 2012/0132907 A1* | 5/2012 | Yamazaki et al. .............. 257/43 |
| 2013/0221343 A1* | 8/2013 | Son et al. ....................... 257/43 |

FOREIGN PATENT DOCUMENTS

| | | |
|---|---|---|
| CN | 101663762 A | 3/2010 |
| CN | 103151378 A | 6/2013 |
| WO | 2014061713 A1 | 4/2014 |

OTHER PUBLICATIONS

First Office Action dated Jul. 13, 2016 corresponding to Chinese application No. 201410334219.5.
Office Action dated Dec. 30, 2016 issued in corresponding Chinese Application No. 201410334219.5.

\* cited by examiner

*Primary Examiner* — Fernando L Toledo
*Assistant Examiner* — Aaron Gray
(74) *Attorney, Agent, or Firm* — Nath, Goldberg & Meyer; Joshua B. Goldberg; Leonid D. Thenor

(57) ABSTRACT

The invention provides a thin film transistor, an array substrate and a display device. The thin film transistor comprises a conductive oxygen vacancy reducing layer for reducing oxygen vacancies in an active layer. The oxygen vacancy reducing layer is disposed between the active layer and a source and/or the active layer and a drain. With the oxygen vacancy reducing layer, the number of the oxygen vacancies in the active layer is decreased greatly, which improves transmission rate of carriers and simultaneously reduces value of subthreshold swing of the thin film transistor.

17 Claims, 2 Drawing Sheets

THIN FILM TRANSISTOR, ARRAY SUBSTRATE AND DISPLAY DEVICE

CROSS-REFERENCE TO RELATED APPLICATION

The present application claims priority based on Chinese Patent Application No. 201410334219.5 filed on Jul. 14, 2014, the entire content of which is incorporated herein by reference.

FIELD OF THE INVENTION

The present invention relates to the field of display technology, and particularly to a thin film transistor, an array substrate comprising the thin film transistor, and a display device comprising the array substrate.

BACKGROUND OF THE INVENTION

Thin film transistors (TFTs) have been widely applied in flat-panel display device due to their perfect switching characteristic.

Generally, a TFT comprises a gate, an active layer, a source and a drain. The source and the drain are disposed separately at two ends of the active layer, and are contact with the active layer respectively. When voltage of the gate is higher than threshold voltage of the gate, the source are electrically connected to the drain through the active layer, and carriers flow from the source to the drain or from the drain to the source.

The active layer of TFT is generally formed by using material of metallic nitrogen-oxide, such as zinc gallium oxynitride, zinc indium oxynitride, zinc aluminum oxynitride, zinc oxynitride (ZnON), and the like. When the TFT is in ON state, trap state for transmission of the carriers may be formed by oxygen vacancies in the metallic nitrogen-oxide, which may decrease transmission rate of the carriers and increase subthreshold swing of TFT. The increased subthreshold swing may impact on operation capacity of TFT seriously.

In addition, contact resistances between the active layer and the source, the drain are usually large, which also impacts on the transmission of the carriers, resulting in larger subthreshold swing of TFT, and thereby impacting on operation capacity of TFT seriously.

SUMMARY OF THE INVENTION

In view of above technical problems existing in the prior art, the present invention provides a thin film transistor, an array substrate, and a display device. With an oxygen vacancy reducing layer provided in the thin film transistor, the number of the oxygen vacancies in the active layer is reduced significantly, thereby the transmission rate of the carriers is increased while the subthreshold swing of TFT is decreased, resulting in improved operation capacity of TFT.

The present invention provides a thin film transistor, comprising a gate, a gate insulation layer, an active layer, a source and a drain, the gate insulation layer being disposed between the gate and the active layer, the source and the drain being disposed at two ends of the active layer, respectively, and the active layer being formed by using material of metallic nitrogen-oxide. The thin film transistor further comprises a conductive oxygen vacancy reducing layer for reducing oxygen vacancies in the active layer, the oxygen vacancy reducing layer being disposed between the active layer and the source, and/or between the active layer and the drain.

Preferably, the oxygen vacancy reducing layer comprises either a first reducing part or a second reducing part, or, the oxygen vacancy reducing layer comprises both the first reducing part and the second reducing part which are separated from each other, wherein the first reducing part is disposed between and contacted with the source and the active layer, and the second reducing part is disposed between and contacted with the drain and the active layer.

Preferably, the oxygen vacancy reducing layer is formed by using material of metal nitride. More preferably, the material of metal nitride is $MoxN(1-x)$ or NdMoN, wherein $0.1<x<1$.

Preferably, projection of the first reducing part on the gate insulation layer is overlapped with projection of the source on the gate insulation layer, and projection of the second reducing part on the gate insulation layer is overlapped with projection of the drain on the gate insulation layer.

Preferably, in a case that the oxygen vacancy reducing layer comprises both the first reducing part and the second reducing part, the first reducing part and the second reducing part are formed simultaneously with formation of the source and the drain.

Preferably, the thin film transistor is of bottom-gate structure.

Preferably, the thin film transistor is of top-gate structure.

Preferably, the thin film transistor further comprises an etch stopping layer which is disposed between the active layer and the source, the drain, the oxygen vacancy reducing layer is located at a side of the etch stopping layer away from the active layer; a first via is opened within a region of the etch stopping layer in which the first reducing part is located so that the first reducing part is contacted with the active layer through the first via; and a second via is opened within a region of the etch stopping layer in which the second reducing part is located so that the second reducing part is contacted with the active layer through the second via.

The present invention further provides an array substrate which comprises the above mentioned thin film transistor.

The present invention further provides a display device which comprises the above mentioned array substrate.

The benefit effects of the invention are as follows. In the thin film transistor provided by the invention, with the oxygen vacancy reducing layer, the number of the oxygen vacancies in the active layer is reduced significantly, thereby the transmission rate of the carriers is increased while the subthreshold swing of TFT is decreased, resulting in improved operation capacity of TFT. Furthermore, contact characteristic between the source and/or drain and the active layer may be improved by improving work function of the oxygen vacancy reducing layer. In other words, contact resistance(s) between the source and/or drain and the active layer may be decreased significantly, and thus the transmission rate of the carriers may be further improved.

In the array substrate of the invention, with the above thin film transistor employed, the performance of the array substrate can be improved. In the display device of the invention, with the above array substrate employed, the performance of the display device can be improved.

Figure 1:
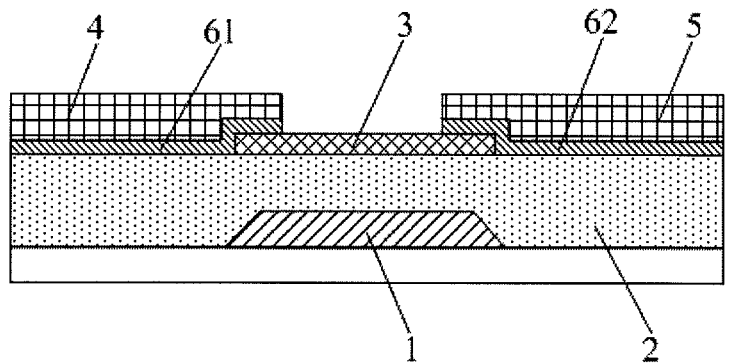
FIG. 1 is a schematic section view of a structure of a thin film transistor in Embodiment 1 of the invention.

REFERENCE NUMERALS 1. gate; 2. gate insulation layer; 3. active layer; 4. source; 5. drain; 61. first reducing part; 62. second reducing part; 7. etch stopping layer; 8. first via; 9. second via.

DETAILED DESCRIPTION OF THE EMBODIMENTS

The thin film transistor, the array substrate and the display device of the invention are described below in detail in conjunction with accompanying drawings as well as embodiments in order that a skilled person in the art may fully understand the technical solutions of the invention.

Embodiment 1

The present embodiment provides a thin film transistor which, as shown in FIG. 1, comprises a gate 1, a gate insulation layer 2, an active layer 3, a source 4 and a drain 5. The gate insulation layer 2 is disposed between the gate 1 and the active layer 3 so as to insulate the gate 1 from the active layer 3. The source 4 and the drain 5 are disposed at two ends of the active layer 3, respectively. The active layer 3 is formed by using material of metallic nitrogen-oxide. The thin film transistor further comprises a conductive oxygen vacancy reducing layer for decreasing oxygen vacancies in the active layer 3. In this embodiment, the oxygen vacancy reducing layer is disposed between the active layer 3 and the source 4, and between the active layer 3 and the drain 5.

The material of metallic nitrogen-oxide may be zinc gallium oxynitride, zinc indium oxynitride, zinc aluminum oxynitride, zinc oxynitride (ZnON), and the like.

In this embodiment, the oxygen vacancy reducing layer comprises a first reducing part 61 and a second reducing part 62 which are separately disposed. The first reducing part 61 is disposed between and contacted with the source 4 and the active layer 3, and the second reducing part 62 is disposed between and contacted with the drain 5 and the active layer 3.

In this embodiment, the oxygen vacancy reducing layer may be formed by using material of metal nitride.

With the disposed oxygen vacancy reducing layer, nitrogen atoms in the oxygen vacancy reducing layer may diffuse into the active layer 3. Such diffusion of the nitrogen atoms can reduce the number of the oxygen vacancies, which may facilitate transmission of carriers during ON state of the thin film transistor, thereby the transmission rate of the carriers is increased while the subthreshold swing of TFT is decreased, resulting in improved operation capacity of TFT. In addition, work function of the oxygen vacancy reducing layer of metal nitride can be controlled by adjusting content of nitrogen to improve contact characteristic of the oxygen vacancy reducing layer with respect to the active layer 3. Thus, contact resistances between the source 4 and drain 5 and the active layer 3 may be reduced significantly, which also facilitates transmission of carriers during ON state of the thin film transistor.

It should be noted that the oxygen vacancy reducing layer may be formed by any other material, as long as such material is conductive and is capable of reducing the oxygen vacancies in the active layer 3.

In this embodiment, projection of the first reducing part 61 on the gate insulation layer 2 is overlapped with projection of the source 4 on the gate insulation layer 2, and projection of the second reducing part 62 on the gate insulation layer 2 is overlapped with projection of the drain 5 on the gate insulation layer 2. With such arrangement, contact characteristic between the source 4 and drain 5 and the active layer 3 may be further improved, transmission rate of carriers may be improved while subthreshold swing of the thin film transistor may be decreased, and thus the operation capacity of the thin film transistor may be improved significantly.

Preferably, the oxygen vacancy reducing layer may be formed by $Mo_xN_{(1-x)}$ or $N_dMoN$, wherein $0.1<x<1$. The oxygen vacancy reducing layer of such material is generally formed by Chemical Vapor Deposition method. During the deposition process, a part of nitrogen atoms in this material may diffuse into the active layer 3. Moreover, when the thin film transistor is in ON state, additional nitrogen atoms will also diffuse from the oxygen vacancy reducing layer to the active layer 3. Thus, the number of the oxygen vacancies in the active layer 3 may be decreased significantly, facilitating transmission of carriers when the thin film transistor is in ON state.

In this embodiment, the first reducing part 61 and the second reducing part 62 may be formed simultaneously with formation of the source 4 and the drain 5. Specifically, a film for the first reducing part 61 and the second reducing part 62 is formed by deposition at first, and then a film for the source 4 and the drain 5 is formed by deposition. Next, a pattern simultaneously including the first reducing part 61, the second reducing part 62, the source 4 and the drain 5 is formed by a single exposure, development and etching process. In this way, additional preparing processes will not be employed, resulting in simple and convenient fabrication.

In this embodiment, the thin film transistor is of bottom-gate structure. As shown in FIG. 1, the gate 1 is located below the active layer 3, and the source 4 and the drain 5 are located over the active layer 3.

Embodiment 2

Figure 2:
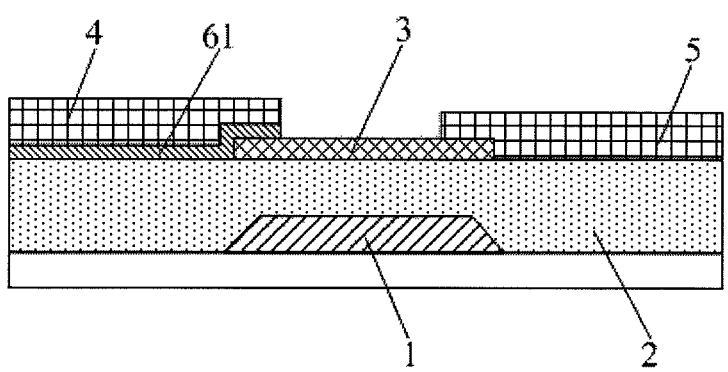
FIG. 2 is a schematic section view of a structure of a thin film transistor in Embodiment 2 of the invention.
Figure 3:
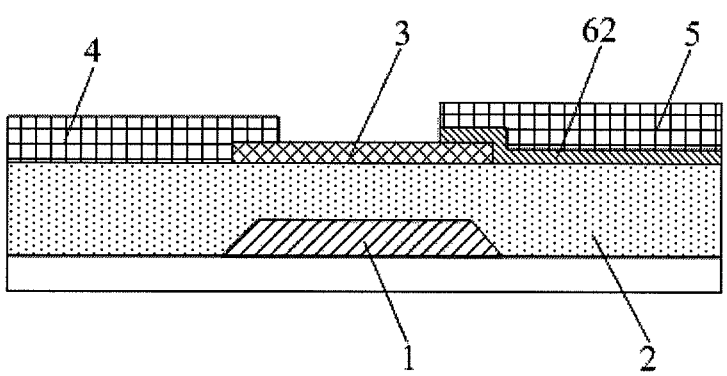
FIG. 3 is a schematic section view of a structure of another thin film transistor in Embodiment 2 of the invention.

The present embodiment provides a thin film transistor, which is different from that of embodiment 1 in that the oxygen vacancy reducing layer in this embodiment comprises only the first reducing part 61 (as shown in FIG. 2) or only the second reducing part 62 (as shown in FIG. 3).

Accordingly, when preparing the thin film transistor shown in FIG. 2, a pattern including the first reducing part 61 is formed by a single patterning process at first, and then a pattern including the source 4 and the drain 5 is formed by another single patterning process. When preparing the thin film transistor shown in FIG. 3, a pattern including the second reducing part 62 is formed by a single patterning process at first, and then a pattern including the source 4 and the drain 5 is formed by another single patterning process.

Except that the thin film transistor of this embodiment is provided with the oxygen vacancy reducing layer, other structures as well as materials for components in the thin film transistor of this embodiment are the same as those in Embodiment 1, thus detail description thereof will be omitted.

Compared with Embodiment 1, the provision of the first reducing part 61 or the second reducing part 61 in this embodiment can also reduce the number of the oxygen vacancies in the active layer 3, improve transmission rate of carriers, decrease subthreshold swing of the thin film transistor, and thus improve the operation capacity of the thin film transistor significantly. However, the number of reduced oxygen vacancies in this embodiment may be less than that in Embodiment 1. Moreover, the oxygen vacancy reducing layer in this embodiment can improve only contact characteristic between the source 4 and the active layer 3, or contact characteristic between the drain 5 and the active layer 3.

Embodiment 3

Figure 4:
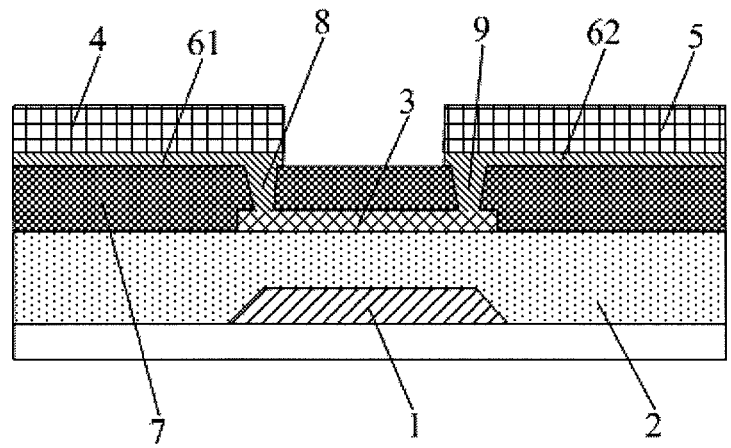
FIG. 4 is a schematic section view of a structure of a thin film transistor in Embodiment 3 of the invention.

The present embodiment provides a thin film transistor which is different from those in Embodiments 1 and 2 in that, as shown in FIG. 4, the thin film transistor further comprises a etch stopping layer 7 which is disposed between the active layer 3 and the source 4 and drain 5. The oxygen vacancy reducing layer is located at a side of the etch stopping layer 7 away from the active layer 3. A first via 8 is opened within a region of the etch stopping layer 7 in which the first reducing part 61 is located so that the first reducing part 61 is contacted with the active layer 3 through the first via 8; and a second via 9 is opened within a region of the etch stopping layer 7 in which the second reducing part 62 is located so that the second reducing part 62 is contacted with the active layer 3 through the second via 9. Although only one first via 8 and only one second via 9 are shown in FIG. 4, it should be understood that a plurality of the first vias 8 and a plurality of the second vias 9 may be provided.

Except that the thin film transistor of this embodiment is provided with the etch stopping layer 7, other structures as well as materials for components in the thin film transistor of this embodiment are the same as those in Embodiments 1 and 2, thus detail description thereof will be omitted.

Embodiment 4

The present embodiment provides a thin film transistor which is different from those in Embodiments 1 to 3 in that, the thin film transistor of the embodiment is of top-gate structure.

Figure 5:
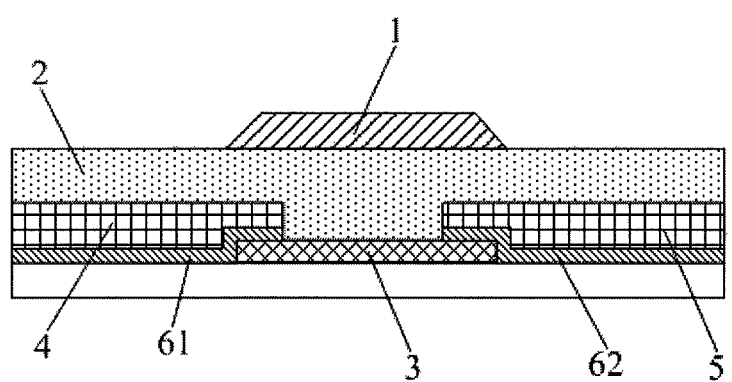
FIG. 5 is a schematic section view of a structure of a thin film transistor in Embodiment 4 of the invention.

Shown in FIG. 5 is a top-gate thin film transistor, in which the gate 1 is located over the source 4 and the drain 5, while the source 4 and the drain 5 are located over the active layer 3.

It should be noted that specific structure of a top-gate thin film transistor is not limited to the above structure, but includes any structure in which the gate is located above the active layer, and examples for the top-gate thin film transistor are omitted herein.

Except that the thin film transistor of this embodiment is of top-gate structure, other structures as well as materials for components in the thin film transistor of this embodiment are the same as those in Embodiments 1 to 3, thus detail description thereof will be omitted.

The benefit effects of Embodiments 1 to 4: in the thin film transistors provided by Embodiments 1 to 4, with the oxygen vacancy reducing layer, the number of the oxygen vacancies in the active layer is reduced significantly, thereby the transmission rate of the carriers is increased while the subthreshold swing of TFT is decreased, resulting in improved operation capacity of TFT. Furthermore, contact characteristic between the source and/or drain and the active layer may be improved by improving work function of the oxygen vacancy reducing layer. In other words, contact resistance(s) between the source and/or drain and the active layer may be decreased significantly, and thus the transmission rate of the carriers may be further improved.

Embodiment 5

The present embodiment provides an array substrate which comprises the thin film transistor in any one of Embodiments 1 to 4.

By employing the thin film transistor in any one of Embodiments 1 to 4, the performance of the array substrate is further improved.

Embodiment 6

The present embodiment provides a display device which comprises the array substrate in Embodiment 5. The display device may be any product or component having display function, such as liquid crystal panel, electronic paper, OLED panel, mobile phone, tablet, television, display, notebook PC, digital album, navigator, and so on.

By employing the array substrate in Embodiment 5, the performance of the display device is further improved.

It can be understood that the above embodiments are only exemplary embodiments for illustrating the principle of the present invention; however, the present invention is not limited thereto. As for a person skilled in the art, various variations and improvements can be made without departing from the spirit and essence of the present invention, and should be considered to be fallen within the protection scope of the present invention.

The invention claimed is:

1. A thin film transistor, comprising a gate, a gate insulation layer, an active layer, a source and a drain, the gate insulation layer being disposed between the gate and the active layer, the source and the drain being disposed at two ends of the active layer, respectively, and the active layer being formed by using material of metallic nitrogen-oxide,
   wherein the thin film transistor further comprises a conductive oxygen vacancy reducing layer for reducing oxygen vacancies in the active layer, the oxygen vacancy reducing layer being disposed between the active layer and the source, and/or between the active layer and the drain,
   wherein the oxygen vacancy reducing layer is formed by using material of metal nitride, and
   wherein the material of metal nitride is NdMoN.

2. The thin film transistor of claim 1, wherein the oxygen vacancy reducing layer comprises both a first reducing part and a second reducing part which are separated from each other,
   wherein the first reducing part is disposed between and contacted with the source and the active layer, and the second reducing part is disposed between and contacted with the drain and the active layer.

3. The thin film transistor of claim 1, wherein
   the oxygen vacancy reducing layer
comprises a first reducing part which is disposed between and contacted with the source and the active layer; or the oxygen vacancy reducing layer comprises a second reducing part which is disposed between and contacted with the drain and the active layer.

4. The thin film transistor of claim 2, wherein projection of the first reducing part on the gate insulation layer is overlapped with projection of the source on the gate insulation layer, and projection of the second reducing part on the gate insulation layer is overlapped with projection of the drain on the gate insulation layer.

5. The thin film transistor of claim 4, wherein the first reducing part and the second reducing part are formed simultaneously with formation of the source and the drain.

6. The thin film transistor of claim 1, wherein the thin film transistor is of bottom-gate structure.

7. The thin film transistor of claim 1, wherein the thin film transistor is of top-gate structure.

8. The thin film transistor of claim 2, further comprising an etch stopping layer which is disposed between the active layer and the source, the drain, the oxygen vacancy reducing layer is located at a side of the etch stopping layer away from the active layer;
  a first via is opened within a region of the etch stopping layer in which the first reducing part is located so that the first reducing part is contacted with the active layer through the first via; and
  a second via is opened within a region of the etch stopping layer in which the second reducing part is located so that the second reducing part is contacted with the active layer through the second via.

9. The thin film transistor of claim 2, further comprising an etch stopping layer which is disposed between the active layer and the source, the drain, the oxygen vacancy reducing layer is located at a side of the etch stopping layer away from the active layer;
  a first via is opened within a region of the etch stopping layer in which the first reducing part is located so that the first reducing part is contacted with the active layer through the first via; and
  a second via is opened within a region of the etch stopping layer in which the second reducing part is located so that the second reducing part is contacted with the active layer through the second via.

10. The thin film transistor of claim 4, further comprising an etch stopping layer which is disposed between the active layer and the source, the drain, the oxygen vacancy reducing layer is located at a side of the etch stopping layer away from the active layer;
  a first via is opened within a region of the etch stopping layer in which the first reducing part is located so that the first reducing part is contacted with the active layer through the first via; and
  a second via is opened within a region of the etch stopping layer in which the second reducing part is located so that the second reducing part is contacted with the active layer through the second via.

11. The thin film transistor of claim 5, further comprising an etch stopping layer which is disposed between the active layer and the source, the drain, the oxygen vacancy reducing layer is located at a side of the etch stopping layer away from the active layer;
  a first via is opened within a region of the etch stopping layer in which the first reducing part is located so that the first reducing part is contacted with the active layer through the first via; and
  a second via is opened within a region of the etch stopping layer in which the second reducing part is located so that the second reducing part is contacted with the active layer through the second via.

12. An array substrate, comprising the thin film transistor of claim 1.

13. The array substrate of claim 12, wherein the oxygen vacancy reducing layer comprises both a first reducing part and a second reducing part which are separated from each other,
  wherein the first reducing part is disposed between and contacted with the source and the active layer, and the second reducing part is disposed between and contacted with the drain and the active layer.

14. The array substrate of claim 12, wherein
  the oxygen vacancy reducing layer comprises a first reducing part which is disposed between and contacted with the source and the active layer; or
  the oxygen vacancy reducing layer comprises a second reducing part which is disposed between and contacted with the drain and the active layer.

15. The array substrate of claim 13, wherein projection of the first reducing part on the gate insulation layer is overlapped with projection of the source on the gate insulation layer, and projection of the second reducing part on the gate insulation layer is overlapped with projection of the drain on the gate insulation layer.

16. The array substrate of claim 13, wherein the thin film transistor further comprising an etch stopping layer which is disposed between the active layer and the source, the drain, the oxygen vacancy reducing layer is located at a side of the etch stopping layer away from the active layer;
  a first via is opened within a region of the etch stopping layer in which the first reducing part is located so that the first reducing part is contacted with the active layer through the first via; and
  a second via is opened within a region of the etch stopping layer in which the second reducing part is located so that the second reducing part is contacted with the active layer through the second via.

17. A display device, comprising the array substrate of claim 12.

* * * * *